United States Patent
Kraft et al.

(10) Patent No.: US 11,851,584 B2
(45) Date of Patent: Dec. 26, 2023

(54) ALTERNATIVE OXIDIZING AGENTS FOR COBALT CMP

(71) Applicant: Cabot Microelectronics Corporation, Aurora, IL (US)

(72) Inventors: Steven Kraft, Naperville, IL (US); Phillip W. Carter, Round Lake, IL (US); Andrew R. Wolff, Darien, IL (US)

(73) Assignee: CMC MATERIALS, INC., Aurora, IL (US)

( * ) Notice: Subject to any disclaimer, the term of this patent is extended or adjusted under 35 U.S.C. 154(b) by 492 days.

(21) Appl. No.: 15/649,378

(22) Filed: Jul. 13, 2017

(65) Prior Publication Data

US 2018/0016469 A1 Jan. 18, 2018

Related U.S. Application Data

(60) Provisional application No. 62/362,222, filed on Jul. 14, 2016.

(51) Int. Cl.
| | | |
|---|---|---|
| *C09G 1/02* | (2006.01) | |
| *C09K 3/14* | (2006.01) | |
| *H01L 21/321* | (2006.01) | |
| *H01L 21/768* | (2006.01) | |

(52) U.S. Cl.
CPC .............. *C09G 1/02* (2013.01); *C09K 3/14* (2013.01); *C09K 3/1463* (2013.01); *H01L 21/3212* (2013.01); *H01L 21/7684* (2013.01)

(58) Field of Classification Search
CPC ......... H01L 21/30625; H01L 21/32115; H01L 2224/03616; H01L 2224/03845; H01L 2224/11616
USPC ........ 252/79.1, 79.4; 438/693; 25/79.1, 79.4
See application file for complete search history.

(56) References Cited

U.S. PATENT DOCUMENTS

| | | | | |
|---|---|---|---|---|
| 5,800,577 A | * | 9/1998 | Kido ......................... | C09G 1/02 51/307 |
| 7,732,393 B2 | | 6/2010 | Grumbine et al. | |
| 9,528,030 B1 | * | 12/2016 | Kraft ......................... | C09G 1/02 |
| 9,688,885 B2 | * | 6/2017 | Kraft ...................... | B24B 37/044 |
| 9,834,704 B2 | * | 12/2017 | Kraft ......................... | C09G 1/02 |
| 2003/0041526 A1 | * | 3/2003 | Fujii ........................ | C09G 1/02 51/307 |
| 2003/0073386 A1 | | 4/2003 | Ma et al. | |
| 2003/0079416 A1 | | 5/2003 | Ma et al. | |
| 2004/0173574 A1 | * | 9/2004 | Grunwald .............. | C09G 1/02 216/83 |
| 2004/0229461 A1 | * | 11/2004 | Darsillo ................... | C23F 3/06 438/689 |
| 2008/0254628 A1 | | 10/2008 | Boggs et al. | |
| 2016/0020087 A1 | * | 1/2016 | Liu ..................... | C11D 11/0047 510/175 |
| 2016/0027657 A1 | * | 1/2016 | Shi ..................... | H01L 21/31111 438/693 |
| 2016/0107289 A1 | | 4/2016 | Cavanaugh et al. | |
| 2016/0108285 A1 | | 4/2016 | Kraft et al. | |
| 2016/0108286 A1 | * | 4/2016 | Sikma ...................... | C09G 1/02 216/53 |
| 2016/0115353 A1 | | 4/2016 | Kraft et al. | |
| 2016/0314989 A1 | * | 10/2016 | Shi ........................ | C09K 3/1463 |

FOREIGN PATENT DOCUMENTS

| | | | | |
|---|---|---|---|---|
| EP | 2977418 B1 | 7/2019 | | |
| JP | 2005056879 A | 3/2005 | | |
| KR | 20100065386 A | 6/2010 | | |
| KR | 20140139498 A | 12/2014 | | |
| TW | 201343905 A | 11/2013 | | |
| WO | 2004101221 A2 | 11/2004 | | |
| WO | 2006133249 A2 | 12/2006 | | |
| WO | 2007044446 A1 | 4/2007 | | |
| WO | WO-2007044446 A1 | * | 4/2007 | ............. C23G 1/106 |
| WO | 2013123317 A1 | 8/2013 | | |
| WO | WO-2013123317 A1 | * | 8/2013 | ........... C11D 3/2079 |
| WO | 2016065060 A1 | 4/2016 | | |

OTHER PUBLICATIONS

Wikipedia, The Free Encyclopedia, "Malic acid" via https://en.wikipedia.org/wiki/Malic_acid ; pp. 1-5; 2019.*
Wikipedia, The Free Encyclopedia, "Tartaric acid" via https://en.wikipedia.org/wiki/Tartaric_acid ; pp. 1-8; 2019.*
Wikipedia, The Free Encyclopedia, "Citric acid" via https://en.wikipedia.org/wiki/Citric_acid ; pp. 1-9; 2019.*
Wikipedia The Free Encyclopedia, "Glycine" via https://en.wikipedia.org/wiki/Glycine#:~:text=Glycine%20(symbol%20Gly%20or%20G,of%20the%20proteinogenic%20amino%20acids. ; pp. 1-11; (Year: 2020).*
Korean Intellectual Property Office as ISA, International Search Report issued in connection with PCT/US2017/041988 dated Dec. 12, 2017.
Kraft et al., "Synthesis and Characterization of a Uranium(JII) Complex Containing a Redox-Active 2,2'-Bipyridine Ligand," Inorganic Chemistry, 2010, 49, 3, 1103-1110.
Taiwan Intellectual Property Office, Search Report issued in connection with Taiwan Patent Application No. 106123275 dated Oct. 25, 2018.
European Patent Office, Extended European Search Report issued in connection with European Patent Application No. 17828487.3 dated Jan. 28, 2020.
China Intellectual Property Office, Office Action issued in connection with CN201780041554.8 dated May 8, 2020.

* cited by examiner

Primary Examiner — Binh X Tran

(57) ABSTRACT

The invention provides a chemical-mechanical polishing composition comprising (a) an abrasive, (b) a cobalt accelerator, and (c) an oxidizing agent that oxidizes a metal, wherein the polishing composition has a pH of about 4 to about 10. The invention further provides a method of chemically-mechanically polishing a substrate with the inventive chemical-mechanical polishing composition. Typically, the substrate contains cobalt.

11 Claims, No Drawings

ALTERNATIVE OXIDIZING AGENTS FOR COBALT CMP

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process whereby material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Cobalt is emerging as a metal for integration into advanced integrated circuit devices. Effective integration of cobalt will require CMP methods with high removal rates, good planarization efficiency, low dishing and erosion, and low defectivity. One method to improve removal rates and planarization efficiency is to incorporate an oxidizing agent in conjunction with a cobalt accelerator. Unfortunately, the current and most widely used oxidizing agent, hydrogen peroxide, is limited in compatibility with other slurry components and has pot-life stability issues.

Thus, a need remains in the art for polishing compositions, comprising alternative oxidizing agents to hydrogen peroxide, that provide high cobalt removal rates and planarization efficiency, while exhibiting acceptable dishing, erosion, and low defectivity.

BRIEF SUMMARY OF THE INVENTION

The invention provides a chemical-mechanical polishing composition comprising (a) an abrasive, (b) a cobalt accelerator, and (c) an oxidizing agent that oxidizes a metal, wherein the oxidizing agent is selected from a nitro compound, a nitroso compound, an N-oxide compound, a nitrite compound, a nitrate compound, a hydroxylamine compound, an oxime compound, and combinations thereof, wherein the polishing composition has a pH of about 4 to about 10.

The invention also provides a method of chemically mechanically polishing a substrate comprising (i) providing a substrate, (ii) providing a polishing pad, (iii) providing a chemical-mechanical polishing composition comprising (a) an abrasive, (b) a cobalt accelerator, and (c) an oxidizing agent that oxidizes a metal, wherein the oxidizing agent is selected from a nitro compound, a nitroso compound, an N-oxide compound, a nitrite compound, a nitrate compound, a hydroxylamine compound, an oxime compound, and combinations thereof, wherein the polishing composition has a pH of about 4 to about 10, (iv) contacting the substrate with the polishing pad and the chemical-mechanical polishing composition therebetween, and (v) moving the polishing pad and the chemical mechanical polishing composition relative to the substrate to abrade at least a portion of the substrate to polish the substrate.

DETAILED DESCRIPTION OF THE INVENTION

The invention provides a chemical-mechanical polishing composition comprising (a) an abrasive, (b) a cobalt accelerator, and (c) an oxidizing agent that oxidizes a metal, wherein the oxidizing agent is selected from a nitro compound, a nitroso compound, an N-oxide compound, a nitrite compound, a nitrate compound, a hydroxylamine compound, an oxime compound, and combinations thereof, wherein the polishing composition has a pH of about 4 to about 10.

The polishing composition comprises an abrasive (i.e., one or more abrasives). The abrasive can be any suitable abrasive or combination of abrasives in the form of particles. For example, the abrasive can be natural or synthetic, and can comprise metal oxide, carbide, nitride, carborundum, diamond, and the like. The abrasive also can be a polymer particle or a coated particle. The abrasive desirably comprises, consists essentially of, or consists of a metal oxide. Typically, the metal oxide is selected from the group consisting of silica, alumina, (e.g., alpha alumina particles (i.e., α-alumina), gamma alumina particles (i.e., γ-alumina), delta alumina particles (i.e., δ-alumina), or fumed alumina particles), ceria, zirconia, co-formed products thereof, and combinations thereof. The abrasive particles are desirably anionic in preferred embodiments.

In an embodiment, the chemical-mechanical polishing composition comprises silica abrasive. The silica can be any suitable silica, for example, the silica can be wet-process silica or fumed silica. Generally, the silica is wet-process silica.

The abrasive particles can have any suitable surface charge. Preferably, the abrasive particles are anionic abrasive particles. By "anionic" it is meant that the abrasive particles have a negative surface charge at the pH of the polishing composition. The abrasive particles can be anionic in their natural state at the pH of the polishing composition, or the abrasive particles can be rendered anionic at the pH of the polishing composition using any method known to those of ordinary skill in the art, such as, for example, by surface metal doping, e.g., by doping with aluminum ions, or by surface treatment with a tethered organic acid, a tethered sulfur-based acid, or a tethered phosphorus-based acid.

The abrasive can have any suitable average particle size (i.e., average particle diameter). The abrasive can have an average particle size of about 5 nm or more, for example, about 10 nm or more, about 15 nm or more, about 20 nm or more, about 25 nm or more, about 30 nm or more, about 35 nm or more, or about 40 nm or more. Alternatively, or in addition, the abrasive can have an average particle size of about 150 nm or less, for example, about 140 nm or less, about 130 nm or less, about 120 nm or less, about 110 nm or less, or about 100 nm or less. Thus, the abrasive can have an average particle size bounded by any two of the above endpoints. For example, the abrasive can have an average particle size of about 5 nm to about 150 nm, about 10 nm to about 140 nm, about 15 nm to about 130 nm, about 20 nm to about 120 nm, about 20 nm to about 110 nm, about 20 nm to about 100 nm, about 30 nm to about 150 nm, about 30 nm to about 140 nm, about 30 nm to about 130 nm, about 30 nm to about 120 nm, about 30 nm to about 110 nm, about 30 nm to about 100 nm, about 35 nm to about 150 nm, about 35 nm to about 140 nm, about 35 nm to about 130 nm, about 35 nm to about 120 nm, about 35 nm to about 110 nm, or about 35 nm to about 100 nm. For spherical abrasive particles, the size of the particle is the diameter of the particle. For non-spherical abrasive particles, the size of the particle is the diameter of the smallest sphere that encompasses the particle. The particle size of the abrasive can be measured using any suitable technique, for example, using laser diffraction techniques. Suitable particle size measurement instruments are available from, for example, Malvern Instruments (Malvern, UK).

The abrasive particles preferably are colloidally stable in the inventive polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable amount of abrasive particles. The polishing composition can comprise about 10 wt. % or less of abrasive particles, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1.5 wt. % or less, about 1 wt. % or less, about 0.9 wt. % or less, about 0.8 wt. % or less, about 0.7 wt. % or less, about 0.6 wt. % or less, or about 0.5 wt. % or less. Alternatively, or in addition, the polishing composition can comprise about 0.05 wt. % or more of abrasive particles, for example, about 0.1 wt. % or more, about 0.2 wt. % or more, about 0.3 wt. % or more, about 0.4 wt. % or more, or about 0.5 wt. % or more. Thus, the polishing composition can comprise abrasive particles in an amount bounded by any two of the aforementioned endpoints. For example, the polishing composition can comprise about 0.05 wt. % to about 10 wt. % of abrasive particles, for example, 0.1 wt. % to about 10 wt. %, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. %, about 0.1 wt. % to about 4 wt. %, about 0.1 wt. % to about 3 wt. %, about 0.1 wt. % to about 2 wt. %, about 0.2 wt. % to about 2 wt. %, about 0.3 wt. % to about 2 wt. %, about 0.4 wt. % to about 2 wt. %, about 0.5 wt. % to about 2 wt. %, about 0.1 wt. % to about 1.5 wt. %, about 0.2 wt. % to about 1.5 wt. %, about 0.3 wt. % to about 1.5 wt. %, about 0.4 wt. % to about 1.5 wt. %, about 0.5 wt. % to about 1.5 wt. %, about 0.1 wt. % to about 1 wt. %, about 0.2 wt. % to about 1 wt. %, about 0.3 wt. % to about 1 wt. %, about 0.4 wt. % to about 1 wt. %, or about 0.5 wt. % to about 1 wt. %.

The polishing composition comprises a cobalt accelerator. The cobalt accelerator can be any suitable cobalt accelerator selected from an N-di(carboxylalkyl)amine, an N-di(hydroxyalkyl)amine, an N,N-di(hydroxyalkyl)-N-carboxylalkylamine, a dicarboxyheterocycle, a heterocyclylalkyl-α-amino acid, an N-aminoalkylamino acid, an unsubstituted heterocycle, an alkyl-substituted heterocycle, a carboxylic acid, a dicarboxylic acid, a tricarboxylic acid, an alkylamine, an N-aminoalkyl-α-amino acid, and combinations thereof.

The cobalt accelerator can be any suitable cobalt accelerator selected from the classes of compounds recited herein. In preferred embodiments, the cobalt accelerator is selected from iminodiacetic acid ("IDA"), N-(2-acetamido)iminodiacetic acid ("ADA"), N-methylimidazole, picolinic acid, dipicolinic acid, 4-(2-hydroxyethyl)-1-piperazineethanesulfonic acid, glycine, bicine, triethylamine ("TEA"), etidronic acid, N-methylmorpholine, malonic acid, 2-pyridinesulfonate, citric acid and combinations thereof.

The cobalt accelerator can be present in the polishing composition in any suitable concentration. Typically, the cobalt accelerator can be present in the polishing composition at a concentration of about 5 mM or more, for example, about 10 mM or more, about 15 mM or more, about 20 mM or more, about 25 mM or more, about 30 mM or more, about 35 mM or more, about 40 mM or more, about 45 mM or more, or about 50 mM or more. Alternatively, or in addition, the cobalt accelerator can be present in the polishing composition at a concentration of about 100 mM or less, for example, about 95 mM or less, about 90 mM or less, about 85 mM or less, about 80 mM or less, about 75 mM or less, about 70 mM or less, about 65 mM or less, or about 60 mM or less. Thus, the cobalt accelerator can be present in the polishing composition at a concentration bounded by any two of the aforementioned endpoints. For example, the cobalt accelerator can be present in the polishing composition at a concentration of about 5 mM to about 100 mM, for example, about 5 mM to about 90 mM, about 5 mM to about 80 mM, about 5 mM to about 70 mM, about 5 mM to about 60 mM, about 10 mM to about 100 mM, about 10 mM to about 90 mM, about 10 mM to about 80 mM, about 10 mM to about 70 mM, about 10 mM to about 60 mM, about 10 mM to about 60 mM, about 20 mM to about 100 mM, about 20 mM to about 90 mM, about 20 mM to about 80 mM, about 20 mM to about 70 mM, or about 20 mM to about 60 mM.

The polishing composition comprises an oxidizing agent that oxidizes a metal. In an embodiment, the oxidizing agent oxidizes cobalt. The oxidizing agent can be any suitable oxidizing agent selected from a nitro compound, a nitroso compound, an N-oxide compound, a nitrite compound, a nitrate compound, a hydroxylamine compound, an oxime compound, and combinations thereof.

The oxidizing agent can be any suitable oxidizing agent selected from the classes of compounds recited herein. In preferred embodiments, the oxidizing agent is selected from an aryl nitro compound, an aryl nitroso compound, an aryl N-oxide compound, an aryl hydroxylamine compound, an aryl oxime compound, a heteroaryl nitro compound, a heteroaryl nitroso compound, a heteroaryl N-oxide compound, a heteroaryl hydroxylamine compound, a heteroaryl oxime compound, a nitrite salt, a nitrate salt, and combinations thereof.

The polishing composition can comprise any suitable amount of the oxidizing agent. Typically, the oxidizing agent can be present in the polishing composition at a concentration of about 1 mM or more, for example, about 5 mM or more, about 10 mM or more, about 15 mM or more, about 20 mM or more, about 25 mM or more, about 30 mM or more, about 35 mM or more, about 40 mM or more, about 45 mM or more, or about 50 mM or more. Alternatively, or in addition, the oxidizing agent can be present in the polishing composition at a concentration of about 100 mM or less, for example, about 95 mM or less, about 90 mM or less, about 85 mM or less, about 80 mM or less, about 75 mM or less, about 70 mM or less, about 65 mM or less, or about 60 mM or less. Thus, the oxidizing agent can be present in the polishing composition at a concentration bounded by any two of the aforementioned endpoints. For example, the oxidizing agent can be present in the polishing composition at a concentration of about 1 mM to about 100 mM, for example, about 1 mM to about 90 mM, about 1 mM to about 80 mM, about 1 mM to about 70 mM, about 1 mM to about 60 mM, about 10 mM to about 100 mM, about 10 mM to about 90 mM, about 10 mM to about 80 mM, about 10 mM to about 70 mM, about 10 mM to about 60 mM, about 10 mM to about 50 mM, about 20 mM to about 100 mM, about 20 mM to about 90 mM, about 20 mM to about 80 mM, about 20 mM to about 70 mM, or about 20 mM to about 60 mM.

In an embodiment, the polishing composition comprises a cobalt corrosion inhibitor. The cobalt corrosion inhibitor can be any suitable cobalt corrosion inhibitor. In an embodiment, the cobalt corrosion inhibitor comprises an anionic head group and a $C_8$-$C_{14}$ aliphatic tail group, for example, a $C_8$-$C_{14}$alkyl or a $C_8$-$C_{14}$alkenyl tail group. The anionic head group can be any suitable anionic head group. In a preferred embodiment, the cobalt corrosion inhibitor comprises a sarcosine derivative having the structure:
R—CON(CH$_3$)CH$_2$COOH wherein CON(CH$_3$)CH$_2$COOH forms the head group and R forms the tail group. The R group is typically a $C_8$-$C_{13}$ aliphatic group and can be a $C_8$-$C_{13}$ alkyl group or a $C_8$-$C_{13}$ alkenyl group, for example, a $C_8$ alkyl group, a $C_9$ alkyl group, a $C_{10}$ alkyl group, a $C_{11}$ alkyl group, a $C_{12}$ alkyl group, a $C_{13}$ alkyl group, a $C_8$ alkenyl group, a $C_9$ alkenyl group, a $C_{11}$ alkenyl group, a $C_{11}$ alkenyl group, a $C_{12}$ alkenyl group, or a $C_{13}$ alkenyl group. In a preferred embodiment wherein the cobalt corrosion inhibitor is a sarcosine derivative, conventional naming of the tail group includes the carbonyl to which the R group is attached for carbon counting purposes. Thus, a $C_{12}$ sarcosinate refers to a lauroyl sarcosinate. When the tail group is an alkenyl group, wherein the double bond is not at the terminus of the tail group, the alkenyl group can have the E configuration or the Z configuration, or can be a mixture of E and Z isomers. The cobalt corrosion inhibitor can be a single compound, or can be a mixture of two or more compounds having an anionic head group and a $C_8$-$C_{20}$ aliphatic tail group. The cobalt corrosion inhibitor also can be a mixture of two or more sarcosine derivatives as described herein having a $C_7$-$C_{19}$ aliphatic R group, provided that about 75 wt. % or more (e.g., about 80 wt. % or more, about 85 wt. % or more, about 90 wt. % or more, or about 95 wt. % or more) of the compounds comprise an anionic head group and a $C_8$-$C_{14}$ aliphatic tail group or are sarcosine derivatives having $C_8$-$C_{13}$ aliphatic R groups.

The polishing composition can comprise any suitable amount of the cobalt corrosion inhibitor. The polishing composition can comprise about 1 ppm or more of the cobalt corrosion inhibitor, for example, about 5 ppm or more, about 10 ppm or more, about 20 ppm or more, about 30 ppm or more, about 40 ppm or more, or about 50 ppm or more. Alternatively, or in addition, the polishing composition can comprise about 1000 ppm or less of the cobalt corrosion inhibitor, for example, about 900 ppm or less, about 800 ppm or less, about 700 ppm or less, about 600 ppm or less, about 500 ppm or less, about 400 ppm or less, about 300 ppm or less, or about 200 ppm or less. Thus, the polishing composition can comprise the cobalt corrosion inhibitor in an amount bounded by any two of the aforementioned endpoints. For example, the polishing composition can comprise about 1 ppm to about 1000 ppm of the cobalt corrosion inhibitor, about 10 ppm to about 1000 ppm, about 10 ppm to about 900 ppm, about 10 ppm to about 800 ppm, about 10 ppm to about 700 ppm, about 10 ppm to about 600 ppm, about 10 ppm to about 500 ppm, about 10 ppm to about 400 ppm, about 20 ppm to about 300 ppm, about 30 ppm to about 200 ppm, about 30 ppm to about 150 ppm, about 30 ppm to about 100 ppm, or about 50 ppm to about 100 ppm.

It will be appreciated that, depending on the pH of the polishing composition, the aforementioned sarcosine derivatives can exist in the form of a salt (e.g., a metal salt, an ammonium salt, or the like), an acid, or as a mixture of an acid and a salt thereof. The acid or salt form of the sarcosine derivatives, or a mixture thereof, is suitable for use in the preparation of the polishing composition.

The polishing composition can have any suitable pH. Typically, the polishing composition can have a pH of about 4 or more, e.g., about 4.5 or more, about 5 or more, about 5.5 or more, about 6 or more, about 6.5 or more, or about 7 or more. Alternatively, or in addition, the polishing composition can have a pH of about 10 or less, e.g., about 9.5 or less, about 9 or less, about 8.5 or less, about 8 or less, or about 7.5 or less. Thus, the polishing composition can have a pH bounded by any two of the above endpoints recited for the polishing composition. For example the polishing composition can have a pH of about 4 to about 10, e.g., about 4.5 to about 10, about 5 to about 10, about 5.5 to about 10, about 6 to about 10, about 6.5 to about 10, about 7 to about 10, about 7 to about 9.5, about 7 to about 9, about 7 to about 8.5, about 7 to about 8, about 5 to about 9, or about 6.5 to about 7.5.

The pH of the polishing composition can be adjusted using any suitable acid or base. Non-limiting examples of suitable acids include nitric acid, sulfuric acid, phosphoric acid, and organic acids such as acetic acid. Non-limiting examples of suitable bases include sodium hydroxide, potassium hydroxide, and ammonium hydroxide, and organic bases such as ethanolamine, diethanolamine, and triethanolamine.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 to about 50 ppm, preferably about 10 to about 40 ppm, more preferably about 20 to about 30 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, cobalt accelerator, optional cobalt corrosion inhibitor, oxidizing agent, optional pH adjustor, etc.) as well as any combination of ingredients (e.g., abrasive, cobalt accelerator, optional cobalt corrosion inhibitor, oxidizing agent, optional pH adjustor, etc.).

For example, the abrasive can be dispersed in water. The cobalt accelerator and optional cobalt corrosion inhibitor can then be added, and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, within about 7 days before use, or within about 14 days before use). The polishing composition also can be prepared by mixing the components at the surface of the substrate during the polishing operation.

The polishing composition can be supplied as a one-package system comprising abrasive, cobalt accelerator, optional cobalt corrosion inhibitor, oxidizing agent, optional pH adjustor, and water. Alternatively, the abrasive can be supplied as a dispersion in water in a first container, and the cobalt accelerator, optional cobalt corrosion inhibitor, oxidizing agent, and optional pH adjustor can be supplied in a second container, either in dry form, or as a solution or dispersion in water. The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, cobalt accelerator, optional cobalt corrosion inhibitor, and optional pH adjustor, with or without the oxidizing agent, in amounts such that, upon dilution of the concentrate with an appropriate amount of water, each component of the polishing composition will be present in the polishing composition in an amount within the appropriate range recited above for each component. For example, the abrasive, cobalt accelerator, optional cobalt corrosion inhibitor, and optional pH adjustor can each be present in the concentration in an amount that is about 2 times (e.g., about 3 times, about 4 times, or about 5 times) greater than the concentration recited above for each component so that, when the concentrate is diluted with an equal volume of water (e.g., 2 equal volumes of water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically mechanically polishing a substrate comprising (i) providing a substrate, (ii) providing a polishing pad, (iii) providing a chemical-mechanical polishing composition comprising (a) an abrasive, (b) a cobalt accelerator, and (c) an oxidizing agent that oxidizes a metal, wherein the polishing composition has a pH of about 4 to about 10, (iv) contacting the substrate with the polishing pad and the chemical-mechanical polishing composition therebetween, and (v) moving the polishing pad and the chemical mechanical polishing composition relative to the substrate to abrade at least a portion of the substrate to polish the substrate.

The substrate to be polished using the method of the invention can be any suitable substrate. In a preferred embodiment, the substrate to be polished contains cobalt. A preferred substrate comprises at least one layer, especially an exposed layer for polishing, comprising, consisting essentially of, or consisting of cobalt, such that at least a portion of the cobalt is abraded (i.e., removed) to polish the substrate. The cobalt may be deposited on a substrate in a variety of ways including chemical vapor deposition (CVD), physical vapor deposition (PVD), or electrochemically plated (ECP). The crystal structure arrangement of Co may vary from hexagonal closest packed (HCP), face-centered cubic (FCC), or amorphous. The microstructure periodicity and grain boundary sizes may range from nanometer to greater than millimeter dimensions. Particularly suitable substrates include, but are not limited to, wafers used in the semiconductor industry. The wafers typically comprise or consist of, for example, a metal, metal oxide, metal nitride, metal composite, metal alloy, a low dielectric material, or combinations thereof. The method of the invention is also useful for polishing substrates comprising cobalt and cobalt alloys useful in turbine blades for gas turbines and jet aircraft engines, orthopedic implants, prosthetic parts such as hip and knee replacements, dental prosthetics, high speed steel drill bits, and permanent magnets.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, polyisocyanurate, co-formed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658, 183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, dishing, and erosion.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

The invention is exemplified by the following embodiments:

(1) In embodiment (1) is presented a chemical-mechanical polishing composition comprising:
 (a) an abrasive;
 (b) a cobalt accelerator; and
 (c) an oxidizing agent that oxidizes a metal, wherein the oxidizing agent is selected from a nitro compound, a nitroso compound, an N-oxide compound, a nitrite compound, a nitrate compound, a hydroxylamine compound, an oxime compound, and combinations thereof, wherein the polishing composition has a pH of about 4 to about 10.

(2) In embodiment (2) is presented the polishing composition of embodiment (1), wherein the cobalt accelerator is selected from an N-di(carboxylalkyl)amine, an N-di(hydroxyalkyl)amine, an N,N-di(hydroxyalkyl)-N-carboxylalkylamine, a dicarboxyheterocycle, a heterocyclylalkyl-α-amino acid, an N-aminoalkylamino acid, an unsubstituted heterocycle, an alkyl-substituted heterocycle, a carboxylic acid, a dicarboxylic acid, a tricarboxylic acid, an alkylamine, an N-aminoalkyl-α-amino acid, and combinations thereof.

(3) In embodiment (3) is presented the polishing composition of embodiment (1) or (2), wherein the polishing composition further comprises a cobalt corrosion inhibitor.

(4) In embodiment (4) is presented the polishing composition of any one of embodiments (1)-(3), wherein the abrasive is silica.

(5) In embodiment (5) is presented the polishing composition of any one of embodiments (1)-(4), wherein the polishing composition comprises about 0.1 wt. % to about 5 wt. % of the abrasive.

(6) In embodiment (6) is presented the polishing composition of embodiment (5), wherein the polishing composition comprises about 0.1 wt. % to about 3 wt. % of the abrasive.

(7) In embodiment (7) is presented the polishing composition of any one of embodiments (1)-(6), wherein the cobalt accelerator is selected from iminodiacetic acid, N-(2-acetamido)iminodiacetic acid, N-methylimidazole, picolinic acid, dipicolinic acid, 4-(2-hydroxyethyl)-1-piperazineethanesulfonic acid, glycine, bicine, triethylamine, etidronic acid, N-methylmorpholine, malonic acid, 2-pyridinesulfonate, citric acid and combinations thereof.

(8) In embodiment (8) is presented the polishing composition of any one of embodiments (1)-(7), wherein the cobalt accelerator is present in the polishing composition at a concentration of about 5 mM to about 100 mM.

(9) In embodiment (9) is presented the polishing composition of embodiment (8), wherein the cobalt accelerator is present in the polishing composition at a concentration of about 10 mM to about 50 mM.

(10) In embodiment (10) is presented the polishing composition of any one of embodiments (1)-(9), wherein the oxidizing agent is selected from an aryl nitro compound, an aryl nitroso compound, an aryl N-oxide compound, an aryl hydroxylamine compound, an aryl oxime compound, and combinations thereof.

(11) In embodiment (11) is presented the polishing composition of any one of embodiments (1)-(9), wherein the oxidizing agent is selected from a heteroaryl nitro compound, a heteroaryl nitroso compound, a heteroaryl N-oxide compound, a heteroaryl hydroxylamine compound, a heteroaryl oxime compound, and combinations thereof.

(12) In embodiment (12) is presented the polishing composition of any one of embodiments (1)-(9), wherein the oxidizing agent is selected from a nitrite salt, a nitrate salt, and combinations thereof.

(13) In embodiment (13) is presented the polishing composition of any one of embodiments (1)-(12), wherein the oxidizing agent is present in the polishing composition at a concentration of about 1 mM to about 100 mM.

(14) In embodiment (14) is presented the polishing composition of embodiment (13), wherein the oxidizing agent is present in the polishing composition at a concentration of about 10 mM to about 50 mM.

(15) In embodiment (15) is presented the polishing composition of any one of embodiments (3)-(14), wherein the cobalt corrosion inhibitor is present in the polishing composition at a concentration of about 10 ppm to about 1000 ppm.

(16) In embodiment (16) is presented the polishing composition of any one of embodiments (1)-(15), wherein the polishing composition has a pH of about 5 to about 9.

(17) In embodiment (17) is presented the polishing composition of embodiment (16), wherein the polishing composition has a pH of about 6.5 to about 7.5.

(18) In embodiment (18) is presented a method of chemically mechanically polishing a substrate comprising:
 (i) providing a substrate,
 (ii) providing a polishing pad,
 (iii) providing a chemical-mechanical polishing composition comprising:
  (a) an abrasive;
  (b) a cobalt accelerator
  (c) an oxidizing agent that oxidizes a metal, wherein the oxidizing agent is selected from a nitro compound, a nitroso compound, an N-oxide compound, a nitrite compound, a nitrate compound, a hydroxylamine compound, an oxime compound, and combinations thereof,
 wherein the polishing composition has a pH of about 4 to about 10, (iv) contacting the substrate with the polishing pad and the chemical-mechanical polishing composition therebetween, and
(v) moving the polishing pad and the chemical mechanical polishing composition relative to the substrate to abrade at least a portion of the substrate to polish the substrate.
(19) In embodiment (19) is presented the method of embodiment (18), wherein the substrate comprises cobalt, and least a portion of the cobalt is abraded to polish the substrate.
(20) In embodiment (20) is presented the method of embodiment (18) or (19), wherein the substrate comprises a semiconductor device.

EXAMPLES

The following examples further illustrate the invention but, of course, should not be construed as in any way limiting its scope.

Example 1

This example demonstrates the impact of the combination of a cobalt accelerator and an oxidizing agent on cobalt static etch rate ("SER").

Cobalt SERs were determined by contacting cobalt coupons (1 cm×1 cm) with different compositions (Compositions 1A-1W) at 35° C. for 5 minutes. Compositions 1B-1W contained 30 mM iminodiacetic acid ("IDA") and 30 mM oxidizing agent at a pH of 7, unless otherwise noted in Table 1, below. For comparison, Composition 1A contained only 30 mM IDA, without an oxidizing agent. Cobalt SERs also were determined by contacting cobalt coupons (1 cm×1 cm) with Compositions 1B-1W without IDA, to demonstrate the impact of a cobalt accelerator on cobalt SER. The results are set forth in Table 1.

TABLE 1

Cobalt SER as a Function of Oxidizing Agent and IDA

| Composition | Oxidizing Agent | Co SER without Iminodiacetic Acid (Å/min) | Co SER with Iminodiacetic Acid (Å/min) |
|---|---|---|---|
| 1A | none | — | 30 |
| 1B | sodium 2,4-dinitrobenzenesulfonate | 1 | 311 |
| 1C | potassium nitrite | 1 | 265 |
| 1D | 4-nitropyridine N-oxide | 2 | 247 |
| 1E | 4-nitropyridine | 0 | 245 |
| 1F | sodium 3-nitrobenzesulfonate | 6 | 174 |
| 1G | 2-nitrophenol | 55 | 99 |
| 1H | sodium 3-nitrobenzoate | 1 | 93 |
| 1I | pyridine N-oxide | 2 | 78 |
| 1J | nitrobenzene | 1 | 68 |
| 1K | trimethyl amine N-oxide dihydrate | 4 | 59 |
| 1L | isonicotinic acid N-oxide | 8 | 57 |
| 1M | diethyl nitromalonate | 1 | 52 |
| 1N | nicotinic acid N-oxide | 2 | 51 |
| 1O | 2-methyl-4(5)-nitroimidazole (15 mM) | 17 | 45 |
| 1P | 4-methylmorpholine N-oxide | 4 | 45 |
| 1Q | 4-cyanopyridine N-oxide | 2 | 42 |
| 1R | picolinic acid N-oxide | 4 | 42 |
| 1S | 4-nitrophthalic acid | 1 | 22 |
| 1T | tris(hydroxymethyl)nitromethane | 1 | 21 |
| 1U | 2-hydroxypyridine N-oxide | 9 | 9 |
| 1V | 5-nitrosalicylic acid | 5 | 5 |
| 1W | 4-nitrocatechol | 2 | 2 |

As is apparent from the results set forth in Table 1, most of the compositions exhibited an improved SER when the oxidizing agent tested was coupled with iminodiacetic acid. Compositions 1B-1N and 1P-1R exhibited a synergistic cobalt SER, meaning that the SER for Compositions 1B-1N and IP-1R exceeded the sum of the SER for the composition without IDA plus the SER for Composition 1A including only IDA. For example, the SER of Composition 1B with IDA was 311 Å/min, which is significantly greater than the sum of the SER of Composition 1B without IDA (i.e., 1 Å/min) and the SER of Composition 1A (i.e., 30 Å/min), i.e., 311 Å/min>31 Å/min.

Example 2

This example demonstrates the cobalt SER exhibited by compositions comprising a cobalt accelerator and an oxidizing agent over a broad pH range.

Cobalt SERs were determined by contacting cobalt coupons (1 cm×1 cm) with different compositions (Compositions 2A-2K) for 5 minutes at 35° C. Compositions 2A-2K contained 30 mM cobalt accelerator and 30 mM 4-nitropyridine N-oxide ("4-NPNO") or 30 mM sodium 3-nitrobenzenesulfonate ("NBS"). The SERs were determined at varying composition pH values of 5, 7, and 9. The results are set forth in Table 2.

Cobalt coupons (1 cm×1 cm) also were contacted with control compositions containing only 30 mM accelerator or only or 30 mM oxidizing agent. For the composition containing only 30 mM accelerator, the cobalt SER was below 30 Å/min. For the composition containing only 30 mM oxidizing agent, the cobalt SER was below 10 Å/min.

TABLE 2

Cobalt SER as a Function of Cobalt Accelerator

| Composition | Accelerator | PH 5 | | PH 7 | | PH 9 | |
| | | 4-NPNO (Å/min) | NBS (Å/min) | 4-NPNO (Å/min) | NBS (Å/min) | 4-NPNO (Å/min) | NBS (Å/min) |
|---|---|---|---|---|---|---|---|
| 2A | IDA | 291 | 143 | 247 | 174 | 211 | 214 |
| 2B | picolinic acid | 241 | 36 | 82 | 104 | 90 | 115 |
| 2C | ADA | 338 | 163 | 117 | 161 | 49 | 107 |

TABLE 2-continued

Cobalt SER as a Function of Cobalt Accelerator

| Composition | Accelerator | PH 5 | | PH 7 | | PH 9 | |
|---|---|---|---|---|---|---|---|
| | | 4-NPNO (Å/min) | NBS (Å/min) | 4-NPNO (Å/min) | NBS (Å/min) | 4-NPNO (Å/min) | NBS (Å/min) |
| 2D | glycine | 233 | 192 | 252 | 153 | 214 | 212 |
| 2E | bicine | 391 | 113 | 254 | 89 | 115 | 4 |
| 2F | N-methylimidizole | 335 | 32 | 168 | 30 | 2 | 14 |
| 2G | malonic acid | 279 | 27 | 10 | 30 | 2 | 11 |
| 2H | TEA | 138 | 250 | 146 | 226 | 0 | 108 |
| 2I | etidronic acid | 326 | 156 | 180 | 115 | 64 | 3 |
| 2J | citric acid | 247 | 43 | 18 | 12 | 20 | 6 |
| 2K | N-methylmorpholine | 267 | 130 | 172 | 100 | 10 | 1 |

As is apparent from the results set forth in Table 2, most of the compositions exhibited a significantly improved SER as compared to control compositions including only a cobalt accelerator or only an oxidizing agent. Indeed, each of Compositions 2A-2K exhibited a synergistic cobalt SER for one or more of the oxidizing agents and pH values tested. A synergistic cobalt SER is defined as an SER above 50 Å/min, which is greater than the sum of the SER for the control composition including only an oxidizing agent (i.e., below 10 Å/min) and the SER for the control composition including only an accelerator (i.e., below 30 Å/min). Compositions 2A and 2D exhibited synergistic cobalt SERs for both oxidizing agents and at each pH value tested.

Example 3

This example demonstrates the relationship between cobalt polishing rates and the SER values shown in Example 1.

Polishing was carried out on a Logitech benchtop polishing machine at 6.9 kPa downforce on a Nexplanar E6088 pad with a slurry flow rate of 50 ml/min, using cobalt physical vapor deposition ("PVD") wafers. The static etch rate experimental procedure was as described in Example 1. Polishing Compositions 3A-3J contained 30 mmol of the oxidizing agent or salt listed in Table 3, 30 mmol of IDA, a biocide, and 0.5% of a colloidal silica abrasive at pH 7. Polishing Composition 3G, lacking an oxidizing agent, contained 30 mmole of potassium acetate and was included as a control. For comparison, Polishing Composition 3K contained 30 mmol of IDA, a biocide, and 0.5% of a colloidal silica abrasive without an oxidizing agent.

TABLE 3

Cobalt Removal Rate as a Function of Oxidizing Agent

| Polishing Composition | Oxidizing Agent | Co SER (Å/min) | Co Removal Rate (Å/min) |
|---|---|---|---|
| 3A | 4-nitropyridine N-oxide | 383 | 3906 |
| 3B | potassium nitrite | 265 | 1639 |
| 3C | sodium 3-nitrobenzesulfonate | 210 | 1550 |
| 3D | diethyl nitromalonate | 52 | 1477 |
| 3E | sodium 3-nitrobenzoate | 93 | 1316 |
| 3F | 2-nitrophenol | 99 | 914 |
| 3G | none | 30 | 742 |
| 3H | 4-hydroxy-3-nitrobenzoic acid | 98 | 661 |
| 3I | 5-nitroisophthalic acid | 85 | 416 |
| 3J | 4-nitrocatechol | 2 | 348 |
| 3K | none | — | 1200 |

As is apparent from the results set forth in Table 3, the cobalt material removal rate generally increases with an increase in cobalt static etch rate ("SER"). Thus, a composition that provides a higher SER desirably provides a higher cobalt removal rate. For example, Polishing Composition 3A exhibits a relatively high static etch rate and a relatively high cobalt removal rate, whereas Polishing Composition 3J exhibits a relatively low static etch rate and a relatively low cobalt removal rate.

Also apparent from the results set forth in Table 3, the cobalt removal rate for Polishing Compositions 3A-3E exceeded the cobalt removal rate for the comparison, Polishing Composition 3K (i.e., 1200 Å/min), which did not contain an oxidizing agent.

Example 4

This example demonstrates the cobalt SER exhibited by compositions containing an N-oxide or 4-nitropyridine oxidizing agent.

Cobalt SERs were determined by contacting cobalt coupons (1 cm×1 cm) with different compositions (Compositions 4A-4O) at 35° C. and a composition pH value of 7. Unless otherwise noted, Compositions 4A-4O contained 30 mM of the oxidizing agent listed in Table 4, and were tested with and without 30 mM of IDA included in the composition. Cobalt SER data for Composition 4A, which did not contain an oxidizing agent, is provided as a control. Cobalt SER data for Composition 4B, which contained $H_2O_2$ as an oxidizing agent, is provided as a comparative example. The results are set forth in Table 4.

TABLE 4

Cobalt SER as a Function of Oxidizing Agent

| Composition | Oxidizing agent | Average Co SER (Å/min) with IDA | Average Co SER (Å/min) without IDA |
|---|---|---|---|
| 4A | None | 40 | — |
| 4B | 0.6% $H_2O_2$ | 62 | — |
| 4C | 2-hydroxypyridine N-oxide | 9 | 9 |
| 4D | 4-nitropyridine N-oxide | 237 | 4 |
| 4E | 4-nitropyridine N-oxide (3 mM) | 145 | — |
| 4F | picolinic acid N-oxide | 42 | 4 |
| 4G | isonicotinic acid N-oxide | 57 | 8 |
| 4H | nicotinic acid N-oxide | 51 | 2 |
| 4I | 4-cyanopyridine N-oxide | 42 | 2 |
| 4J | 4-methylmorpholine N-oxide | 45 | 4 |
| 4K | pyridine N-oxide | 78 | 2 |
| 4L | trimethyl amine N-oxide dihydrate | 59 | 4 |
| 4M | 4-nitropyridine | 179 | 4 |
| 4N | 4-chloropyridine N-oxide | 60 | 1 |
| 4O | 4-methoxypyridine N-oxide | 117 | 22 |

As is apparent from the results set forth in Table 4, the combination of IDA and an oxidizing agent of the present invention provides a significant enhancement of cobalt SER. Compare, for example, the cobalt SERs provided by Compositions 4D, 4E, 4M, and 4O with the cobalt SER provided by Composition 4A, which does not contain an oxidizing agent. In particular, Compositions 4D, 4E, 4M, and 4O enhance cobalt SER by at least 77 Å/min as compared to the cobalt SER provided by Composition 4A.

Table 4 also demonstrates the ability of Compositions 4C-4O, which include oxidizing agents of the present invention, to etch cobalt at rates similar to, or better than, the etch rate provided by Composition 4B, which contains $H_2O_2$ as an oxidizing agent. $H_2O_2$ is a typical oxidizing agent used in the chemical-mechanical polishing compositions. Polishing Compositions 4D, 4E, 4M, and 4O, in particular, drastically outperformed 0.6% $H_2O_2$ in cobalt SER, enhancing cobalt SER by at least 55 Å/min as compared to the cobalt SER provided by Composition 4B.

In addition, and as demonstrated by the cobalt SER provided by Composition 4E, the most active oxidizing agent, 4-nitropyridine N-oxide, maintains a high degree of activity at a concentration as low as 3 mM.

Example 5

This example demonstrates the cobalt removal rates for cobalt polishing compositions comprising a cobalt inhibitor and a biocide.

Polishing was performed on a Logitech benchtop polishing machine, using a 4 cm×4 cm cobalt film coupon. Polishing Compositions 5A-5L contained 0.5% silica abrasive, 30 mM accelerator, oxidizing agent (30 mM for non-peroxide based molecules), 31 ppm biocide, and optionally a cobalt inhibitor, as indicated in Table 5. Each polishing composition had a pH value of 7. The cobalt removal rates are reported in Table as a percentage relative to the cobalt removal rate provided by comparative Polishing Composition 3K (described in Example 3 and Table 3, above). In other words, the results are reported as a percentage relative to a cobalt removal rate of 1200 Å/min (e.g., Observed Removal Rate (Å/min)/1200)*100).

TABLE 5

Cobalt Removal Rate as a Function of Accelerator and Oxidizing Agent

| Polishing Composition | Accelerator | Oxidizing Agent | 50 ppm Inhibitor | Relative Co RR |
|---|---|---|---|---|
| 5A | IDA | 0.6% $H_2O_2$ | Yes | 302 |
| 5B | IDA | 4-nitropyridine N-oxide | Yes | 287 |
| 5C | IDA | 4-methoxypyridine N-oxide | Yes | 154 |
| 5D | IDA | 4-methoxypyridine N-oxide | No | 171 |
| 5E | IDA | 4-chloropyridine N-oxide | Yes | 98 |
| 5F | IDA | 4-nitropyridine | Yes | 220 |
| 5G | IDA | pyridine N-oxide | Yes | 69 |
| 5H | IDA | isonicotinic acid N-oxide | Yes | 62 |
| 5I | IDA | nicotinic acid N-oxide | Yes | 56 |
| 5J | N-methylimidazole | 4-nitropyridine N-oxide | No | 411 |
| 5K | N-methylimidazole | 4-nitropyridine N-oxide | Yes | 40 |
| 5L | picolinic acid | 4-nitropyridine N-oxide | Yes | 260 |

As demonstrated by this example, Polishing Compositions including oxidizing agents and cobalt inhibitors according to the present invention desirably provide beneficial cobalt polishing rates. More specifically, this example demonstrates the polishing effectiveness of polishing compositions including 4-nitropyridine, 4-nitropyridine N-oxide, or 4-methoxypyridine N-oxide as alternatives to $H_2O_2$. Compare, for example, the removal rates provided by Polishing Compositions 5B-5D, 5F, 5J and 5L with the removal rate provided by comparative Polishing Composition 3K, which does not contain an oxidizing agent.

Furthermore, Polishing Compositions 5J and 5L exemplify N-methylimidazole and picolinic acid as beneficial accelerators for polishing compositions employing oxidizing agents of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive, wherein the abrasive is silica;
   (b) a cobalt accelerator, wherein the cobalt accelerator is present in the polishing composition at a concentration of about 5 mM to about 100 mM;
   (c) an oxidizing agent that oxidizes cobalt, wherein the oxidizing agent is selected from a heteroaryl nitro compound, a heteroaryl nitroso compound, a heteroaryl N-oxide compound, a heteroaryl hydroxylamine compound, a heteroaryl oxime compound, and combinations thereof,
   wherein the polishing composition has a pH of about 4 to about 10.

2. The polishing composition of claim 1, wherein the polishing composition further comprises a cobalt corrosion inhibitor.

3. The polishing composition of claim 1, wherein the cobalt accelerator is present in the polishing composition at a concentration of about 10 mM to about 50 mM.

4. The polishing composition of claim 1, wherein the cobalt accelerator is selected from an N-di(carboxylalkyl)amine, an N-di(hydroxyalkyl)amine, an N,N-di(hydroxyalkyl)-N-carboxylalkylamine, a dicarboxyheterocycle, a heterocyclylalkyl-α-amino acid, an N-aminoalkylamino acid, an unsubstituted heterocycle, an alkyl-substituted heterocycle, a carboxylic acid, a dicarboxylic acid, a tricarboxylic acid, an alkylamine, an N-aminoalkyl-α-amino acid, and combinations thereof.

5. The polishing composition of claim 4, wherein the cobalt accelerator is selected from iminodiacetic acid, N-(2-acetamido)iminodiacetic acid, N-methylimidazole, picolinic acid, dipicolinic acid, 4-(2-hydroxyethyl)-1-piperazineethanesulfonic acid, glycine, bicine, triethylamine, etidronic acid, N-methylmorpholine, malonic acid, 2-pyridinesulfonate, citric acid and combinations thereof.

6. The polishing composition of claim 1, wherein the polishing composition comprises about 0.1 wt. % to about 5 wt. % of the abrasive.

7. The polishing composition of claim 6, wherein the polishing composition comprises about 0.1 wt. % to about 3 wt. % of the abrasive.

8. The polishing composition of claim 1, wherein the oxidizing agent is present in the polishing composition at a concentration of about 1 mM to about 100 mM.

9. The polishing composition of claim 8, wherein the oxidizing agent is present in the polishing composition at a concentration of about 10 mM to about 50 mM.

10. The polishing composition of claim 1, wherein the polishing composition has a pH of about 5 to about 9.

11. The polishing composition of claim 10, wherein the polishing composition has a pH of about 6.5 to about 7.5.

* * * * *